(12) United States Patent
Inatomi et al.

(10) Patent No.: US 11,028,483 B2
(45) Date of Patent: Jun. 8, 2021

(54) PLATING METHOD, PLATING APPARATUS AND RECORDING MEDIUM

(71) Applicant: Tokyo Electron Limited, Tokyo (JP)

(72) Inventors: Yuichiro Inatomi, Kumamoto (JP); Takashi Tanaka, Kumamoto (JP); Kazutoshi Iwai, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/344,932

(22) PCT Filed: Aug. 29, 2017

(86) PCT No.: PCT/JP2017/031003
§ 371 (c)(1),
(2) Date: Apr. 25, 2019

(87) PCT Pub. No.: WO2018/079057
PCT Pub. Date: May 3, 2018

(65) Prior Publication Data
US 2019/0256980 A1    Aug. 22, 2019

(30) Foreign Application Priority Data

Oct. 27, 2016  (JP) .............................. JP2016-210901

(51) Int. Cl.
*C23C 18/18*    (2006.01)
*C23C 18/16*    (2006.01)
(Continued)

(52) U.S. Cl.
CPC .......... *C23C 18/1893* (2013.01); *C23C 18/16* (2013.01); *C23C 18/1608* (2013.01);
(Continued)

(58) Field of Classification Search
CPC ............ C23C 18/1603; C23C 18/1605; C23C 18/1607; C23C 18/1608; C23C 18/1639;
(Continued)

(56) References Cited

U.S. PATENT DOCUMENTS 3,640,789 A * 2/1972 Hepfer ................... H05K 3/182
156/92
4,865,873 A * 9/1989 Cole, Jr. ................. H05K 3/184
427/555

FOREIGN PATENT DOCUMENTS

EP    0 260 514 A1    3/1988
JP    S63-105973 A    5/1988
(Continued)

OTHER PUBLICATIONS

International Search Report for International Application No. PCT/JP2017/031003, dated Oct. 10, 2017.

*Primary Examiner* — Dah-Wei D. Yuan
*Assistant Examiner* — Nga Leung V Law
(74) *Attorney, Agent, or Firm* — Pearne & Gordon LLP

(57) ABSTRACT

A substrate W having a non-plateable material portion 31 and a plateable material portion 32 formed on a surface thereof is prepared, and then, a catalyst is selectively imparted to the plateable material portion 32 by performing a catalyst imparting processing on the substrate W. Thereafter, a plating layer 35 is selectively formed on the plateable material portion 32 by performing a plating processing on the substrate W. Before the imparting of the catalyst, an organic film 36 is formed on the substrate W by supplying an organic liquid L1 onto the substrate W.

5 Claims, 8 Drawing Sheets

(51) Int. Cl.
    *C23C 18/34*      (2006.01)
    *H01L 21/3065*    (2006.01)
    *H01L 21/033*     (2006.01)
    *H01L 21/3205*    (2006.01)

(52) U.S. Cl.
    CPC .............. *C23C 18/18* (2013.01); *C23C 18/34* (2013.01); *H01L 21/0332* (2013.01); *H01L 21/0337* (2013.01); *H01L 21/3065* (2013.01); *H01L 21/3205* (2013.01)

(58) Field of Classification Search
    CPC . C23C 18/1642; C23C 18/1893; C23C 18/18; C23C 18/16; C23C 18/34; C23C 18/1619; C23C 18/1865; C23C 18/1632; C23C 18/36; C23C 18/1834; C23C 18/1844; C23C 18/1882; C23C 18/30; H01L 21/0332; H01L 21/3205; H01L 21/0337; H01L 21/3065
    See application file for complete search history.

(56) References Cited

FOREIGN PATENT DOCUMENTS

| | | |
|---|---|---|
| JP | H07-166372 | 6/1995 |
| JP | 2009-249679 A | 10/2009 |
| JP | 2012-164967 A | 8/2012 |
| JP | 2015-079885 A | 4/2015 |

\* cited by examiner

PLATING METHOD, PLATING APPARATUS AND RECORDING MEDIUM

CROSS-REFERENCE TO RELATED APPLICATION

This Application is a U.S. national phase application under 35 U.S.C. § 371 of PCT Application No. PCT/JP2017/031003 filed on Aug. 29, 2017, which claims the benefit of Japanese Patent Application No. 2016-210901 filed on Oct. 27, 2016, the entire disclosures of which are incorporated herein by reference.

TECHNICAL FIELD

The various aspects and embodiments described herein pertain generally to a plating method, a plating apparatus and a recording medium.

BACKGROUND

Recently, as miniaturization and three-dimension of semiconductor devices are required, it is required to improve processing accuracy by etching when processing the semiconductor devices. As one way to improve the processing accuracy by etching, it is required to improve accuracy of a hard mask (HM) for dry etching which is formed on a substrate.

Patent Document 1: Japanese Patent Laid-open Publication No. 2009-249679

In general, however, there are many restrictions for a material of the hard mask. For example, the material of the hard mask needs to have high adhesivity to a substrate and a resist, needs to have high resistance against a heat treatment, and an etching processing, and, also, needs to be easily removed. For the reason, conventionally, only a limited material such as SiN (silicon nitride) or TiN (titanium nitride) has been used as the material of the hard mask.

In view of this, the present inventors have examined providing a film of $SiO_2$ (silicon oxide) or the like and a film of SiN (silicon nitride) or the like on a substrate; applying a catalyst such as Pd on the substrate to selectively apply the catalyst on the SiN film; and forming a plating layer only on the SiN film by using this catalyst. In this case, as the plating layer formed on the SiN film can be used as the hard mask, it is possible to select various kinds of materials as the plating layer.

Meanwhile, the SiO film on the substrate may have a minute lattice defect, an impurity, or the like. In such a case, the catalyst of Pd or the like may adhere to the lattice defect or the impurity. Accordingly, if the plating processing is performed in this state, the plating layer may be formed on a part of the SiO film as well, which is not intended originally, raising a concern that such an unnecessary plating layer might end up as a defect.

SUMMARY

In view of the foregoing, exemplary embodiments provide a plating method, a plating apparatus capable of suppressing generation of a defect on a non-plateable material portion, and a recording medium therefor.

In an exemplary embodiment, a plating method includes preparing a substrate having a non-plateable material portion and a plateable material portion formed on a surface thereof; imparting a catalyst selectively to the plateable material portion by performing a catalyst imparting processing on the substrate; and forming a plating layer selectively on the plateable material portion by performing a plating processing on the substrate. Before the imparting of the catalyst, forming an organic film is performed on the substrate by supplying an organic liquid onto the substrate.

In another exemplary embodiment, a plating apparatus includes a substrate holding unit configured to hold a substrate having a plateable material portion and a non-plateable material portion on a surface thereof; a catalyst imparting unit configured to impart a catalyst selectively to the plateable material portion by performing a catalyst imparting processing on the substrate; a plating liquid supply unit configured to form a plating layer selectively on the plateable material portion by supplying a plating liquid onto the substrate; and an organic liquid supply unit configured to form an organic film on the substrate by supplying an organic liquid onto the substrate.

According to the exemplary embodiments, it is possible to suppress the generation of the defect on the non-plateable material portion.

DETAILED DESCRIPTION

Hereinafter, exemplary embodiments will be explained with reference to the accompanying drawings.

<Configuration of Plating Apparatus>

Figure 1:
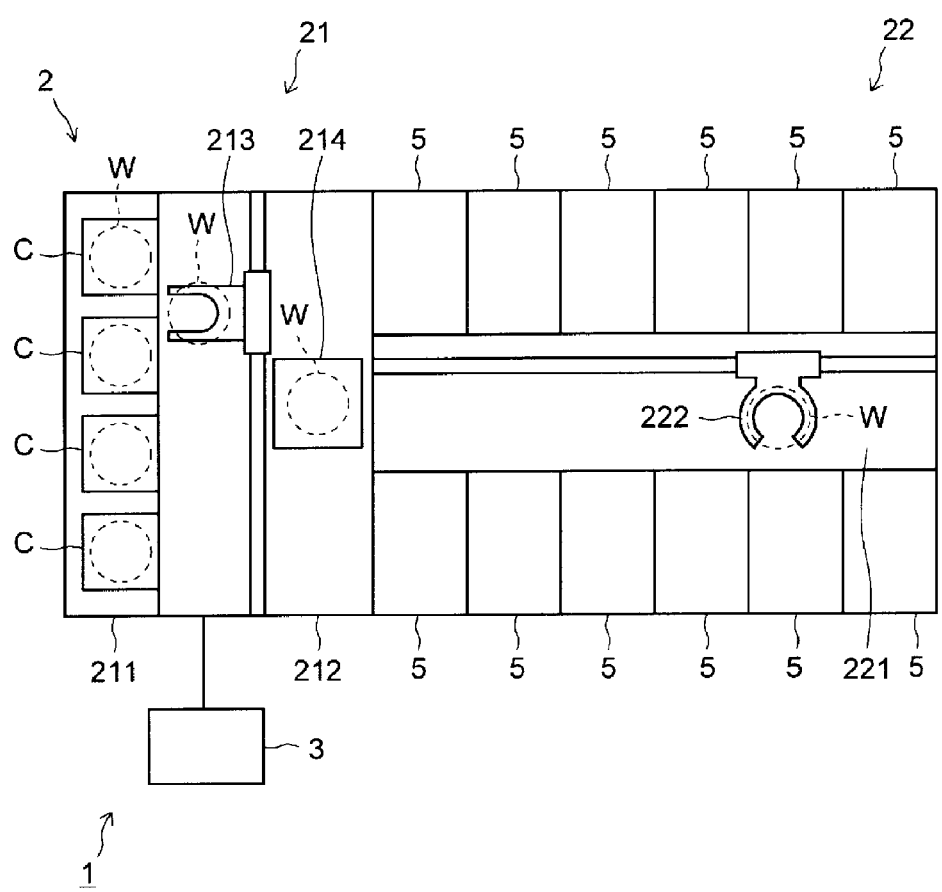
FIG. 1 is a schematic plan view illustrating a configuration of a plating apparatus and a plating unit provided in the plating apparatus.

Referring to FIG. 1, a configuration of a plating apparatus according to an exemplary embodiment will be explained. FIG. 1 is a schematic diagram illustrating the configuration of the plating apparatus according to the exemplary embodiment.

As depicted in FIG. 1, a plating apparatus 1 according to the present exemplary embodiment is equipped with a plating unit 2 and a controller 3 configured to control an operation of the plating unit 2.

The plating unit 2 is configured to perform various processings on a substrate. The various processings performed by the plating unit 2 will be discussed later.

The controller 3 is implemented by, for example, a computer, and includes an operation controller and a storage unit. The operation controller is implemented by, for example, a CPU (Central Processing Unit) and is configured to control an operation of the plating unit 2 by reading and executing the programs stored in the storage unit. The storage unit is implemented by a memory device such as, but not limited to, a RAM (Random Access Memory), a ROM (Read Only Memory) or a hard disk, and stores thereon programs for controlling various processings performed in the plating unit 2. Further, the programs may be recorded in a computer-readable recording medium, or may be installed from the recording medium to the storage unit. The computer-readable recording medium may be, for example, a hard disc (HD), a flexible disc (FD), a compact disc (CD), a magnet optical disc (MO), or a memory card. Stored in the recording medium is a program which, when executed by a computer for controlling an operation of the plating apparatus 1, allows the computer to control the plating apparatus 1 to perform a plating method to be described later.

<Configuration of Plating Unit>

Referring to FIG. 1, a configuration of the plating unit 2 will be discussed. FIG. 1 is a schematic plan view illustrating the configuration of the plating unit 2.

The plating unit 2 includes a carry-in/out station 21 and a processing station 22 which is provided adjacent to the carry-in/out station 21.

The carry-in/out station 21 is equipped with a placing section 211 and a transfer section 212 which is provided adjacent to the placing section 211.

In the placing section 211, transfer containers (hereinafter, referred to as "carriers C") for accommodating therein a plurality of substrates W horizontally are placed.

The transfer section 212 is equipped with a transfer device 213 and a delivery unit 214. The transfer device 213 is provided with a holding mechanism configured to hold a substrate W and is configured to be movable horizontally and vertically and pivotable around a vertical axis.

The processing station 22 includes plating devices 5. In the present exemplary embodiment, the number of the plating devices 5 belonging to the processing station 22 is two or more. However, only one plating device 5 may be provided. The plating devices 5 are arranged at both sides of a transfer path 221 which is extended in a preset direction.

A transfer device 222 is provided in the transfer path 221. The transfer device 222 is equipped with a holding mechanism configured to hold the substrate W and is configured to be movable horizontally and vertically and pivotable around a vertical axis.

In the plating unit 2, the transfer device 213 of the carry-in/out station 21 is configured to transfer the substrate W between the carrier C and the delivery unit 214. To elaborate, the transfer device 213 takes out the substrate W from the carrier C which is placed in the placing section 211, and places the substrate W in the delivery unit 214. Further, the transfer device 213 takes out the substrate W which is placed in the delivery unit 214 by the transfer device 222 of the processing station 22, and accommodates the substrate W back into the carrier C on the placing section 211.

In the plating unit 2, the transfer device 222 of the processing station 22 is configured to transfer the substrate W between the delivery unit 214 and the plating device 5 and between the plating device 5 and the delivery unit 214. To elaborate, the transfer device 222 takes out the substrate W which is placed in the delivery unit 214 and then carries the substrate W into the plating device 5. Further, the transfer device 222 takes out the substrate W from the plating device 5 and places the substrate W in the delivery unit 214.

<Configuration of Plating Device>

Figure 2:
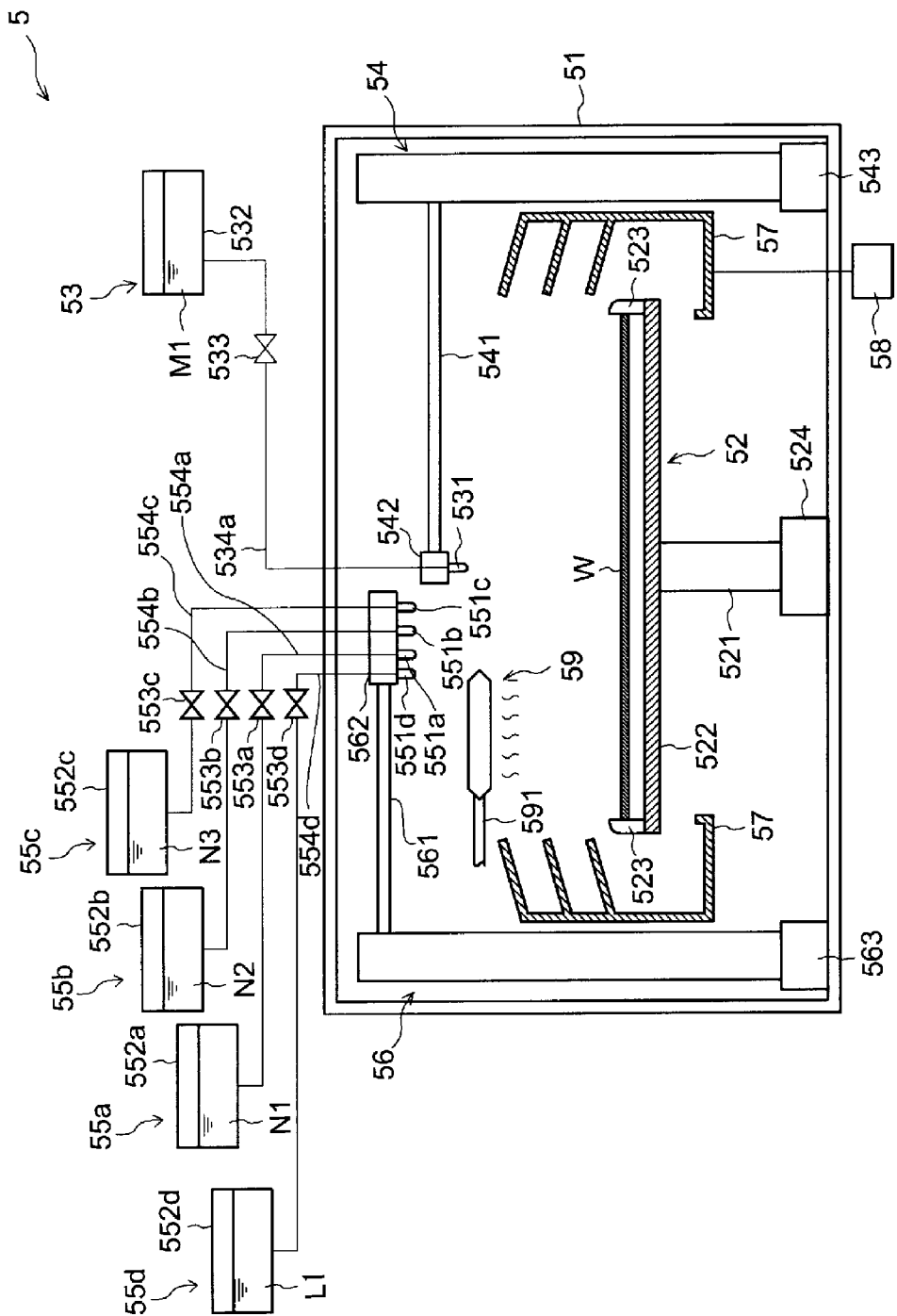
FIG. 2 is a schematic cross sectional view illustrating a configuration of a plating device belonging to the plating unit shown in FIG. 1.

Referring to FIG. 2, a configuration of the plating device 5 will be explained. FIG. 2 is a schematic cross sectional view illustrating the configuration of the plating device 5.

The plating device 5 is configured to perform a plating processing on a substrate W having a non-plateable material portion 31 and a plateable material portion 32 on a surface thereof, and configured to form a plating layer 35 selectively on the plateable material portion (see FIG. 3 to FIG. 7D to be described later). A substrate processing performed by the plating device 5 includes a catalyst imparting processing and an electroless plating processing at least. However, the substrate processing may further include processings other than the catalyst imparting processing and the plating processing.

The plating device 5 is configured to perform a substrate processing including the aforementioned electroless plating processing. The plating device 5 includes a chamber 51; a substrate holding unit 52 provided within the chamber 51 and configured to hold the substrate W; and a plating liquid supply unit 53 configured to supply a plating liquid M1 to the substrate W held by the substrate holding unit 52.

The substrate holding unit 52 includes a rotation shaft 521 extended in a vertical direction within the chamber 51; a turntable 522 provided at an upper end portion of the rotation shaft 521; a chuck 523 provided on an outer peripheral portion of a top surface of the turntable 522 and configured to support an edge portion of the substrate W; and a driving unit 524 configured to rotate the rotation shaft 521.

The substrate W is supported by the chuck 523 to be horizontally held by the turntable 522 while being slightly spaced apart from the top surface of the turntable 522. In the present exemplary embodiment, a mechanism of holding the substrate W by the substrate holding unit 52 is of a so-called mechanical chuck type in which the edge portion of the substrate W is held by the chuck 523 which is configured to be movable. However, a so-called vacuum chuck type of vacuum-attracting a rear surface of the substrate W may be used instead.

A base end portion of the rotation shaft 521 is rotatably supported by the driving unit 524, and a leading end portion of the rotation shaft 521 sustains the turntable 522 horizontally. If the rotation shaft 521 is rotated, the turntable 522 placed on the upper end portion of the rotation shaft 521 is rotated, and, as a result, the substrate W which is held by the turntable 522 with the chuck 523 is also rotated.

The plating liquid supply unit 53 is equipped with a nozzle 531 configured to discharge the plating liquid M1 onto the substrate W held by the substrate holding unit 52; and a plating liquid supply source 532 configured to supply the plating liquid M1 to the nozzle 531. The plating liquid M1 is stored in a tank of the plating liquid supply source 532, and the plating liquid M1 is supplied into the nozzle 531 from the plating liquid supply source 532 through a supply passageway 534a which is equipped with a flow rate controller such as a valve 533.

The plating liquid M1 is an autocatalytic (reduction) plating liquid for electroless plating. The plating liquid M1 contains a metal ion such as a cobalt (Co) ion, a nickel (Ni) ion, a tungsten (W) ion; and a reducing agent such as hypophosphorous acid or dimethylamineborane. Further, in the autocatalytic (reduction) electroless plating, the metal ion in the plating liquid M1 is reduced by the electrons emitted in an oxidation reaction of the reducing agent in the plating liquid M1 to be precipitated as a metal, so that a metal film (plating film) is formed. The plating liquid M1 may further contain an additive or the like. The metal film (plating film) formed by the plating processing with the plating liquid M1 may be, by way of non-limiting example, CoB, CoP, CoWP, CoWB, CoWBP, NiWB, NiB, NiWP, NiWBP, or the like. P in the metal film (plating film) is originated from the reducing agent (e.g., hypophosphorous acid) containing P, and B in the plating film is originated from the reducing agent (e.g., dimethylamineborane) containing B.

The nozzle 531 is connected to a nozzle moving device 54. The nozzle moving device 54 is configured to drive the nozzle 531. The nozzle moving device 54 includes an arm 541, a moving body 542 which is configured to be movable along the arm 541 and has a driving mechanism embedded therein; and a rotating/elevating device 543 configured to rotate and move the arm 541 up and down. The nozzle 531 is provided at the moving body 542. The nozzle moving device 54 is capable of moving the nozzle 531 between a position above a center of the substrate W held by the substrate holding unit 52 and a position above a periphery of the substrate W, and is also capable of moving the nozzle 531 up to a stand-by position outside a cup 57 to be described later when viewed from the top.

Within the chamber 51, there are arranged a catalyst solution supply unit (catalyst imparting unit) 55a, a cleaning liquid supply unit 55b, a rinse liquid supply unit 55c and an organic liquid supply unit 55d configured to supply a catalyst solution N1, a cleaning liquid N2, a rinse liquid N3 and an organic liquid L1 onto the substrate W held by the substrate holding unit 52, respectively.

The catalyst solution supply unit (catalyst imparting unit) 55a includes a nozzle 551a configured to discharge the catalyst solution N1 onto the substrate W held by the substrate holding unit 52; and a catalyst solution supply source 552a configured to supply the catalyst solution N1 to the nozzle 551a. The catalyst solution N1 is stored in a tank of the catalyst solution supply source 552a, and the catalyst solution N1 is supplied to the nozzle 551a from the catalyst solution supply source 552a through a supply passageway 554a which is provided with a flow rate controller such as a valve 553a.

The cleaning liquid supply unit 55b includes a nozzle 551b configured to discharge the cleaning liquid N2 onto the substrate W held by the substrate holding unit 52; and a cleaning liquid supply source 552b configured to supply the cleaning liquid N2 to the nozzle 551b. The cleaning liquid N2 is stored in a tank of the cleaning liquid supply source 552b, and the cleaning liquid N2 is supplied to the nozzle 551b from the cleaning liquid supply source 552b through a supply passageway 554b which is provided with a flow rate controller such as a valve 553b.

The rinse liquid supply unit 55c includes a nozzle 551c configured to discharge the rinse liquid N3 onto the substrate W held by the substrate holding unit 52; and a rinse liquid supply source 552c configured to supply the rinse liquid N3 to the nozzle 551c. The rinse liquid N3 is stored in a tank of the rinse liquid supply source 552c, and the rinse liquid N3 is supplied to the nozzle 551c from the rinse liquid supply source 552c through a supply passageway 554c which is provided with a flow rate controller such as a valve 553c.

The organic liquid supply unit 55d includes a nozzle 551d configured to discharge the organic liquid L1 onto the substrate W held by the substrate holding unit 52; and an organic liquid supply source 552d configured to supply the organic liquid L1 to the nozzle 551d. The organic liquid L1 is stored in a tank of the organic liquid supply source 552d, and the organic liquid L1 is supplied to the nozzle 551d from the organic liquid supply source 552d through a supply passageway 554d which is provided with a flow rate controller such as a valve 553d.

The catalyst solution N1 contains a metal ion having catalytic activity to the oxidation reaction of the reducing agent in the plating liquid M1. In the electroless plating processing, in order for precipitation of the metal ion in the plating liquid M1 to be started, an initial film surface (that is, a plating target surface of the substrate) needs to have sufficient catalytic activity to the oxidation reaction of the reducing agent in the plating liquid M1. As an example, such a catalyst may include, by way of example, but not limitation, an iron group element (Fe, Co, Ni), a platinum metal element (Ru, Rh, Pd, Os, Ir, Pt), Cu, Ag or Au. The metal film having the catalytic activity is formed through a replacement reaction. In the replacement reaction, a component forming the plating target surface of the substrate serves as the reducing agent, and the metal ion (e.g., Pd ion) in the catalyst solution N1 is reduced to be precipitated on the plating target surface of the substrate. Further, the catalyst solution N1 may contain a metal catalyst in the form of nanoparticles. To be more specific, the catalyst solution N1 may contain a metal catalyst in the form of nanoparticles, a dispersant and an aqueous solution. The metal catalyst in the form of nanoparticles may be, by way of non-limiting example, nanoparticle-shaped palladium (Pd). Further, the dispersant serves to allow the metal catalyst in the form of nanoparticles to be easily dispersed in the catalyst solution N1. One containing the same component as the main component of the organic liquid L1 may be used as the dispersant. To be specific, the dispersant may be, by way of non-limiting example, polyvinylpyrrolidone (PVP).

As an example of the cleaning liquid N2, an organic acid such as a formic acid, malic acid, a succinic acid, a citric acid or a malonic acid, or hydrofluoric acid (DHF) (aqueous solution of hydrogen fluoride) diluted to the extent that it does not corrode the plating target surface of the substrate may be used.

As an example of the rinse liquid N3, pure water may be used.

The organic liquid L1 is a liquid having a function of suppressing the catalyst to adhere to the non-plateable material portion 31 of the substrate W. As an example of this organic liquid L1, one containing polyvinylpyrrolidone (PVP) may be used.

The plating device 5 includes a nozzle moving device 56 configured to move the nozzles 551a to 551d. The nozzle moving device 56 is equipped with an arm 561; a moving body 562 which is configured to be movable along the arm 561 and has a moving mechanism embedded therein; and a rotating/elevating device 563 configured to rotate and move the arm 561 up and down. The nozzles 551a to 551d are provided at the moving body 562. The nozzle moving device 56 is capable of moving the nozzles 551a to 551d between a position above the central portion of the substrate W held by the substrate holding unit 52 and a position above the peripheral portion of the substrate W, and also capable of moving the nozzles 551a to 551d up to a stand-by position outside the cup 57 to be described later when viewed from the top. In the present exemplary embodiment, though the nozzles 551a to 551d are held by the common arm, they may be configured to be held by different arms and moved independently.

A heating device 59 (heater) configured to heat-treat (bake) the substrate W held by the substrate holding unit 52 is also provided within the chamber 51. The heating device 59 serves to volatilize a solvent in the organic liquid L1 or accelerate polymerization of the organic liquid L1 by heating the surface of the substrate W on which the organic liquid L1 is supplied. The heating device 59 heats the surface of the substrate W to a temperature equal to or higher than 100° C. and to the extent that the organic film such as the polyvinylpyrrolidone (PVP) is not decomposed. The heating device 59 is connected to an arm 591, and this arm 591 is configured to be pivotable and movable up and down by a non-illustrated rotating/elevating device. The heating device 59 is configured to be moved to a position above the substrate W by the rotating/elevating device only when the bake of the substrate W is required. In other cases, the heating device 59 is kept retreated at a position outside the substrate W.

The cup 57 is disposed around the substrate holding unit 52. The cup 57 is configured to receive various kinds of processing liquids (e.g., the plating liquid, the cleaning liquid, the rinse liquid, the organic liquid, etc.) scattered from the substrate W and drain the received processing liquids to the outside of the chamber 51. The cup 57 is equipped with an elevating device 58 configured to move the cup 57 up and down.

<Structure of Substrate>

Now, a structure of the substrate in which a plating layer is to be formed by a plating method according to the present exemplary embodiment will be explained.

Figure 3:
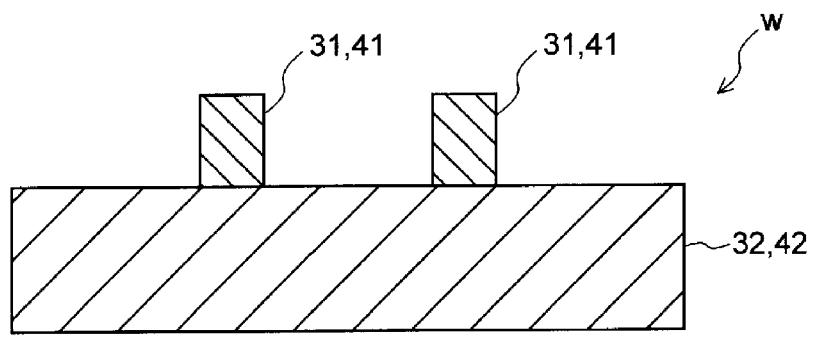
FIG. 3 is a schematic cross sectional view illustrating a structure of a substrate on which a plating layer is to be formed by a plating method according to an exemplary embodiment.

As depicted in FIG. 3, a substrate W on which a plating layer 35 is to be formed includes the non-plateable material portion 31 and the plateable material portion 32 respectively formed on a surface thereof. There is no specific limitation in the structure of the non-plateable material portion 31 and the plateable material portion 32 as long as they are exposed at the surface side of the substrate W. In the present exemplary embodiment, the substrate W includes a base member 42 made of the plateable material portion 32 and a core member 41 which is protruded from the base member 42 and is made of the non-plateable material portion 31 having a pattern shape.

The non-plateable material portion 31 is a region where a plating metal is not precipitated so that the plating layer 35 is not formed when a plating processing according to the present exemplary embodiment is performed. In the present exemplary embodiment, the non-plateable material portion 31 is made of a material containing $SiO_2$ as a main component. Further, as will be described later, the non-plateable material portion 31 includes a minute lattice defect, an impurity, or the like.

The plateable material portion 32 is a region where the plating metal is selectively precipitated so that the plating layer 35 is formed when the plating processing according to the present exemplary embodiment is performed. In the present exemplary embodiment, the plateable material portion 32 may be made of any one of (1) a material containing at least one of a $OCH_x$ group or a $NH_x$ group; (2) a metal material containing a Si-based material as a main component; (3) a material containing a catalyst metal material as a main component; and (4) a material containing carbon as a main component.

(1) In case that the material of the plateable material portion 32 includes, as the main component, the material containing at least one of the $OCH_x$ group or the $NH_x$ group, this material may be a material containing a Si—$OCH_x$ group or a Si—$NH_x$ group such as SiOCH or SiN.

(2) In case that the material of the plateable material portion 32 is the metal material containing the Si-based material as the main component, the material of the plateable material portion 32 may be, by way of non-limiting example, B-doped or P-doped poly-Si, poly-Si or Si.

(3) In case that the plateable material portion 32 includes, as the main component, the material containing the catalyst metal material as the main component, the material of the plateable material portion 32 may be, by way of example, but not limitation, Cu or Pt.

(4) In case that the plateable material portion 32 includes, as the main component, the material containing the carbon as the main component, the material of the plateable material portion 32 may be, for example, amorphous carbon.

Figure 4A:
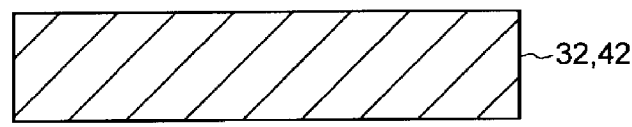
FIG. 4A to FIG. 4E are schematic cross sectional views illustrating a manufacturing method for a substrate on which the plating layer is to be formed by the plating method according to the present exemplary embodiment.

Now, a method of fabricating the substrate W shown in FIG. 3 will be explained with reference to FIG. 4A to FIG. 4E. To produce the substrate W shown in FIG. 3, the base member 42 made of the plateable material portion 32 is first prepared, as illustrated in FIG. 4A.

Figure 4B:
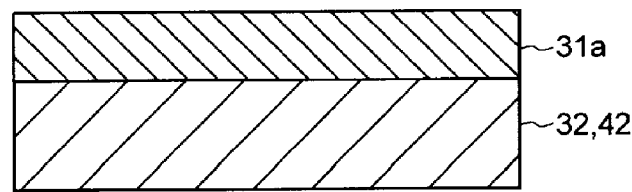

Thereafter, as depicted in FIG. 4B, a film of a material 31a, which forms the non-plateable material portion 31, is formed on the entire surface of the base member 42 made of the plateable material portion 32 by a CVD method, a PVD method or the like. The material 31a is composed of, for example, the material containing $SiO_2$ as the main component.

Figure 4C:
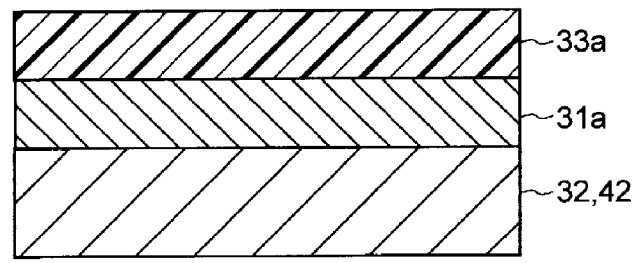
Figure 4D:
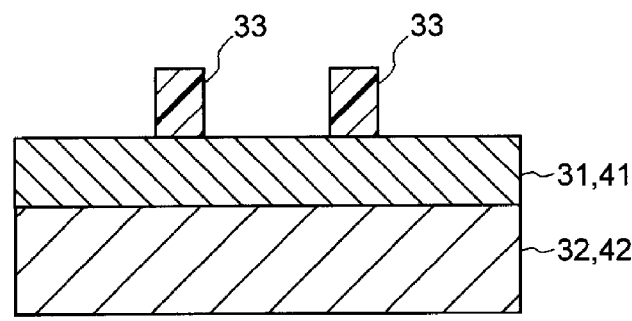

Subsequently, as illustrated in FIG. 4C, a photosensitive resist 33a is coated on the entire surface of the material 31a forming the non-plateable material portion 31 and is dried. Then, by exposing the photosensitive resist 33a through a photo mask and developing it, a resist film 33 having a required pattern is formed, as shown in FIG. 4D.

Figure 4E:
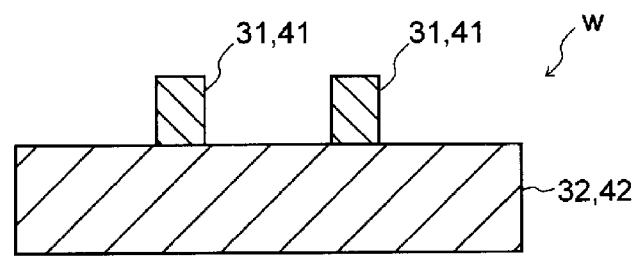

Afterwards, as depicted in FIG. 4E, the material 31a is dry-etched by using the resist film 33 as a mask. As a result, the core member 41 made of the non-plateable material portion 31 is patterned to have substantially the same shape as the pattern shape of the resist film 33. Then, by removing the resist film 33, there is obtained the substrate W having the non-plateable material portion 31 and the plateable material portion 32 formed on the surface thereof.

<Plating Method>

Now, a plating method using the plating apparatus 1 will be discussed. The plating method performed by plating apparatus 1 includes a plating processing upon the aforementioned substrate W. The plating processing is performed by the plating device 5. An operation of the plating device 5 is controlled by the controller 3.

Figure 5:
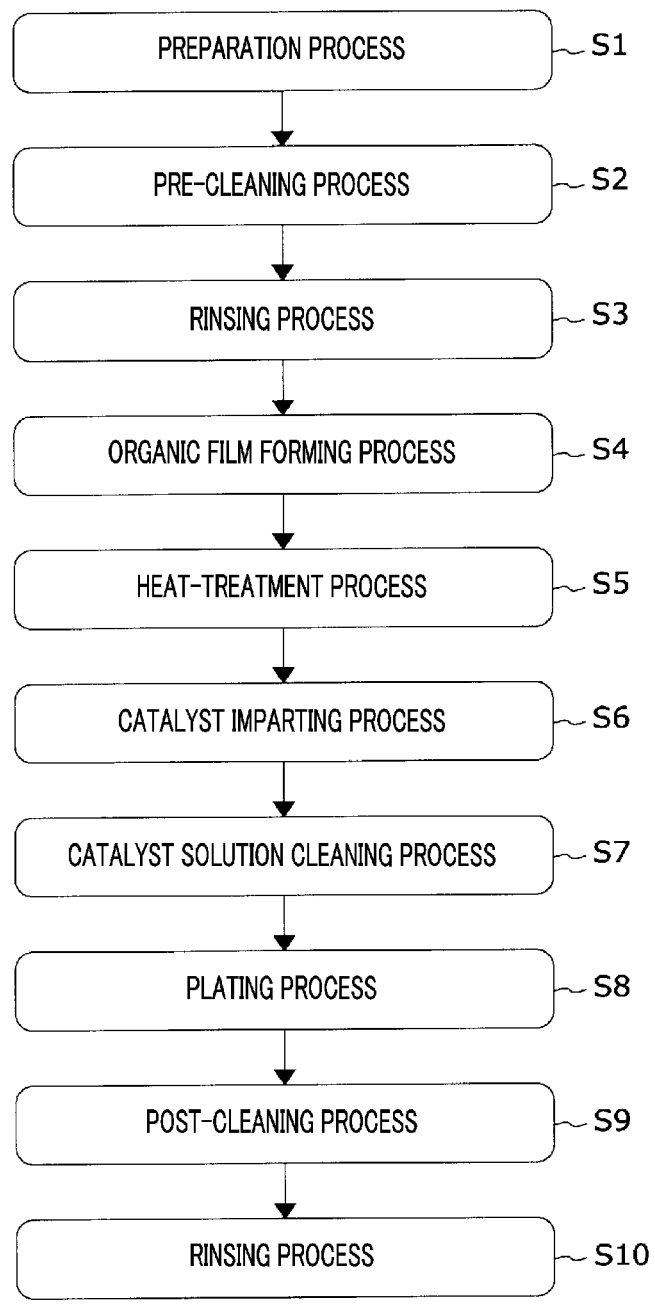
FIG. 5 is a flowchart illustrating the plating method according to the exemplary embodiment.
Figure 6A:
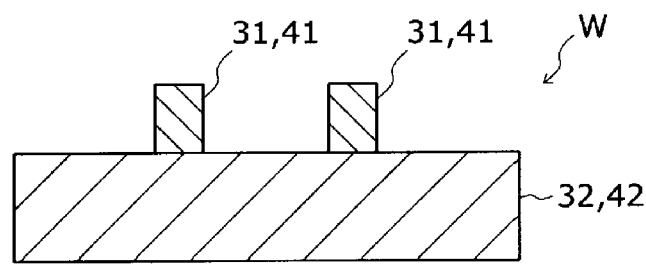
FIG. 6A to FIG. 6C are schematic cross sectional views illustrating the plating method according to the exemplary embodiment.
Figure 6B:
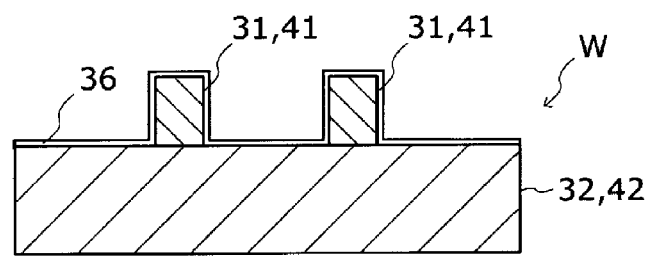
Figure 6C:
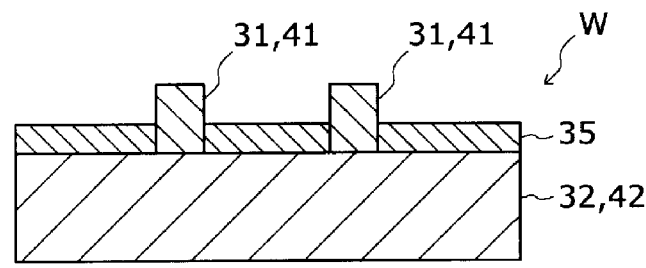

First, the substrate W having the non-plateable material portion 31 and the plateable material portion 32 formed on the surface thereof is prepared by performing the above-described method of FIG. 4A to FIG. 4E (preparation process: process S1 of FIG. 5) (see FIG. 6A).

The prepared substrate W is then carried into the plating device 5 and is held by the substrate holding unit 52 (see FIG. 2). In the meanwhile, the controller 3 controls the elevating device 58 to move the cup 57 down to a preset position. Then, the controller 3 controls the transfer device 222 to place the substrate W on the substrate holding unit 52. The substrate W is horizontally placed on the turntable 522 while its periphery portion is held by the chuck 523.

Then, the substrate W held by the substrate holding unit 52 is cleaned (pre-cleaning process: process S2 of FIG. 5). At this time, while controlling the driving unit 524 to rotate the substrate W held by the substrate holding unit 52 at a preset speed, the controller 3 controls the cleaning liquid supply unit 55b to locate the nozzle 551b at a position above the substrate W and to supply the cleaning liquid N2 onto the substrate W from the nozzle 551b. The cleaning liquid N2 supplied onto the substrate W is diffused on the surface of the substrate W by a centrifugal force which is caused by the rotation of the substrate W. As a result, a deposit or the like adhering to the substrate W is removed from the substrate W. The cleaning liquid N2 scattered from the substrate W is drained through the cup 57.

Subsequently, the substrate W after being cleaned is rinsed (rinsing process: process S3 of FIG. 5). At this time, while controlling the driving unit 524 to rotate the substrate W held by the substrate holding unit 52 at a preset speed, the controller 3 controls the rinse liquid supply unit 55c to locate the nozzle 551c at a position above the substrate W and to supply the rinse liquid N3 onto the substrate W from the nozzle 551c. The rinse liquid N3 supplied onto the substrate W is diffused on the surface of the substrate W by the centrifugal force which is caused by the rotation of the substrate W. As a result, the cleaning liquid N2 remaining on the substrate W is washed away. The rinse liquid N3 scattered from the substrate W is drained through the cup 57.

Then, the organic film is formed on the substrate W held by the substrate holding unit 52 (organic film forming process: process S4 of FIG. 5). At this time, while controlling the driving unit 524 to rotate the substrate W held by the substrate holding unit 52 at a preset speed, the controller 3 controls the organic liquid supply unit 55d to locate the nozzle 551d at a position above the substrate W and to supply the organic liquid L1 onto the substrate W from the nozzle 551d. As an example of the organic liquid L1, polyvinylpyrrolidone (PVP) may be used. The organic liquid L1 supplied onto the substrate W is diffused on the surface of the substrate W by the centrifugal force which is caused by the rotation of the substrate W. As a result, a thin organic film 36 is formed both on the surface of the non-plateable material portion 31 and on the surface of the plateable material portion 32 of the substrate W (see FIG. 6B). This organic film 36 serves to suppress a catalyst from adhering to the non-plateable material portion 31 in a catalyst imparting process. The organic liquid L1 scattered from the substrate W is drained through the cup 57.

Afterwards, the substrate W held by the substrate holding unit 52 is heat-treated (baked) (heat-treatment process: process S5 of FIG. 5). At this time, while controlling the driving unit 524 to rotate the substrate W held by the substrate holding unit 52 at a preset speed, the controller 3 controls the heating device 59 to be located at a position above the substrate W and to heat the substrate W. The heating device 59 heats the surface of the substrate W to a temperature equal to or higher than 100° C. and to the extent that the organic film such as the polyvinylpyrrolidone (PVP) is not decomposed. The heating device 59 heats the substrate W such that a surface temperature of the substrate W falls within a range from, e.g., 230° C. to 270° C. As a result, the solvent in the organic liquid L1 is volatilized, and the polymerization of the organic liquid L1 can be accelerated.

Thereafter, a catalyst imparting processing is performed on the substrate W having the organic film 36 formed thereon (catalyst imparting process: process S6 of FIG. 5). At this time, while controlling the driving unit 524 to rotate the substrate W held by the substrate holding unit 52 at a preset speed, the controller 3 controls the catalyst solution supply unit 55a to locate the nozzle 551a at a position above the substrate W and to supply the catalyst solution N1 onto the substrate W from the nozzle 551a. The catalyst solution N1 supplied onto the substrate W is diffused on the surface of the substrate W by the centrifugal force which is caused by the rotation of the substrate W. The catalyst solution N1 scattered from the substrate W is drained through the cup 57.

Accordingly, the catalyst is selectively imparted to the plateable material portion 32 of the substrate W, so that the metal film having catalytic activity is formed on the plateable material portion 32. Meanwhile, the catalyst is not substantially imparted to the non-plateable material portion 31 of the substrate W, which is mainly made of $SiO_2$, so that the metal film having the catalytic activity is not formed at this non-plateable material portion 31. By way of example, the metal having such catalytic activity may include, but not limitation, an iron group element (Fe, Co, Ni), a platinum metal element (Ru, Rh, Pd, Os, Ir, Pt), Cu, Ag or Au. Each of these metals have high adsorption property to the material (e.g., SiN) forming the plateable material portion 32, whereas each of these metals is difficult to adsorb with respect to the material (e.g., $SiO_2$) forming the non-plateable material portion 31. For this reason, by using each of the aforementioned metals, a plating metal can be selectively precipitated on the plateable material portion 32. To be specific, the catalyst solution N1 may contain the Pd catalyst in the form of nanoparticles, the dispersant composed of polyvinylpyrrolidone (PVP), and the aqueous solution. Further, the catalyst solution N1 may contain an adsorption promoter which promotes the adsorption of the metal having the catalytic activity.

In the present exemplary embodiment, the organic film 36 is formed on the non-plateable material portion 31. Accordingly, even if the lattice defect, the impurity or the like exists at a part of the non-plateable material portion 31, the adhesion of the catalyst to this portion is suppressed as this portion is covered with the organic film 36. Meanwhile, since the catalyst is strongly adsorbed to the plateable material portion 32, there is no concern that the presence of the organic film 36 hampers the adhesion of the catalyst to the plateable material portion 32.

Subsequently, the substrate W, in which the catalyst is selectively imparted on the plateable material portion 32, is cleaned (catalyst solution cleaning process: process S7 of FIG. 5). To elaborate, while controlling the driving unit 524 to rotate the substrate W held by the substrate holding unit 52 at a preset speed, the controller 3 controls the rinse liquid supply unit 55c to locate the nozzle 551c at the position above the substrate W and to supply the rinse liquid N3 onto the substrate W from the nozzle 551c. The rinse liquid N3 supplied onto the substrate W is diffused on the surface of the substrate W by the centrifugal force which is caused by the rotation of the substrate W. As a result, the catalyst solution N1 remaining on the substrate W is washed away. At this time, the organic film 36 is also removed by the rinse liquid N3. Further, even if the catalyst adheres to a part of the non-plateable material portion 31 with the organic film 36 therebetween, this catalyst is washed away along with the organic film 36. Accordingly, the catalyst is more securely suppressed from remaining on the non-plateable material portion 31. The rinse liquid N3 scattered from the substrate W is drained through the cup 57. Here, the substrate W may be cleaned by using, instead of the rinse liquid N3, an acidic cleaning liquid such as, but not limited to, hydrofluoric acid (DHF).

Then, the plating processing is performed on the substrate W, and the plating is selectively performed on the plateable material portion 32 (plating process: process S8 of FIG. 5). Resultantly, the plating layer 35 is formed on the plateable material portion 32 (see FIG. 6C). The plating layer 35 is formed at a portion of the plateable material portion 32 where the non-plateable material portion 31 is not covered. At this time, while controlling the driving unit 524 to rotate the substrate W held by the substrate holding unit 52 at a preset speed or while maintaining the substrate W held by the substrate holding unit 52 stopped, the controller 3 controls the plating liquid supply unit 53 to locate the nozzle 531 at a position above the substrate W and to supply the plating liquid M1 onto the substrate W from the nozzle 531. Accordingly, the plating metal is selectively precipitated on the plateable material portion 32 (specifically, on the metal film, having the catalytic activity, formed on the surface of the plateable material portion 32) of the substrate W, so that the plating layer 35 is obtained. Meanwhile, since the metal film having the catalytic activity is not formed on the non-plateable material portion 31 of the substrate W, the plating metal is not substantially precipitated and no plating layer 35 is formed thereat.

After the plating processing as described above is completed, the substrate W held by the substrate holding unit 52 is cleaned (post-cleaning process: process S9 of FIG. 5). At this time, while controlling the driving unit 524 to rotate the substrate W held by the substrate holding unit 52 at a preset speed, the controller 3 controls the cleaning liquid supply unit 55b to locate the nozzle 551b at the position above the substrate W and to supply the cleaning liquid N2 onto the substrate W from the nozzle 551b. The cleaning liquid N2 supplied onto the substrate W is diffused on the surface of the substrate W by the centrifugal force which is caused by the rotation of the substrate W. Accordingly, the abnormal plating film or the reaction by-product adhering to the substrate W is removed from the substrate W. The cleaning liquid N2 scattered from the substrate W is drained through the cup 57.

Then, while controlling the driving unit 524 to rotate the substrate W held by the substrate holding unit 52 at a preset speed, the controller 3 controls the rinse liquid supply unit 55c to locate the nozzle 551c at the position above the substrate W and to supply the rinse liquid N3 onto the substrate W from the nozzle 551c (rinsing process: process S10 of FIG. 5). Accordingly, the plating liquid M1, the cleaning liquid N2 and the rinse liquid N3 on the substrate W are scattered from the substrate W by the centrifugal force which is caused by the rotation of the substrate W, and are drained through the cup 57.

Thereafter, the substrate W on which the plating layer 35 is formed is carried out of the plating device 5. At this time, the controller 3 controls the transfer device 222 to take out the substrate W from the plating device 5 and place the taken-out substrate W in the delivery unit 214. Then, the controller 3 controls the transfer device 213 to take out the substrate W placed in the delivery unit 214 and to carry the substrate W into the carrier C in the placing section 211.

Then, the substrate W is etched by using the plating layer 35 as a hard mask layer.

Figure 7A:
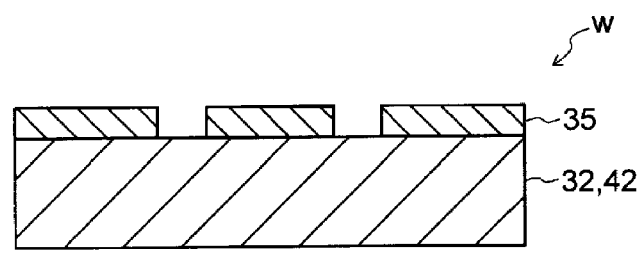
FIG. 7A to FIG. 7C are schematic cross sectional views illustrating a method of processing the substrate on which the plating layer is formed by the plating method according to the present exemplary embodiment.

In this case, the non-plateable material portion 31 is first removed selectively from the substrate W which is taken out of the plating device 5 (FIG. 7A). Meanwhile, the plating layer 35 formed on the plateable material portion 32 remains without being removed.

Figure 7B:
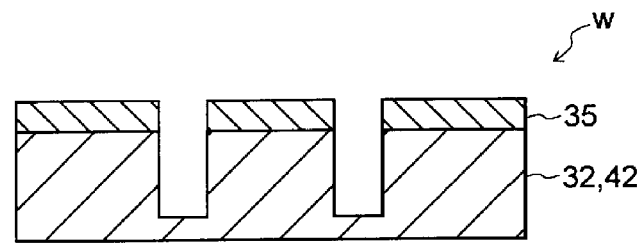

Subsequently, as shown in FIG. 7B, the base member 42 made of the plateable material portion 32 is dry-etched by using the plating layer 35 as a hard mask. Accordingly, the portion of the base member 42 which is not covered with the plating layer 35 is etched to a preset depth, and recesses having a pattern shape are formed.

Figure 7C:
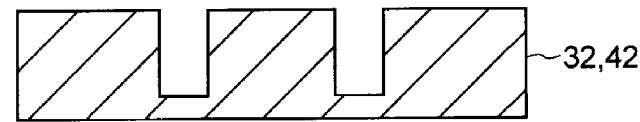

Afterwards, by removing the plating layer 35 through a wet cleaning method, the base member 42 provided with the recesses having the pattern shape is obtained, as illustrated in FIG. 7C. Since the plating layer 35 can be removed by the wet cleaning method, it is easy to remove the plating layer 35. An acidic solvent is employed as a chemical liquid for this wet cleaning method.

As stated above, according to the present exemplary embodiment, there is performed the process of forming the organic film 36 on the substrate W by supplying the organic liquid L1 onto the substrate W prior to the process of imparting the catalyst to the substrate W. Accordingly, it is difficult to attach the catalyst to the non-plateable material portion 31. Thus, even if the lattice defect, the impurity or the like exists at a part of the non-plateable material portion 31, this portion is covered with the organic film 36, so that adhesion of the catalyst to this portion is suppressed. As a result, after the plating processing, the plating layer is not formed at the part of the non-plateable material portion 31 where the plating layer is not intended to be formed. Therefore, it is possible to suppress the problem that the non-plateable material portion 31 has the defect.

Figure 8A:
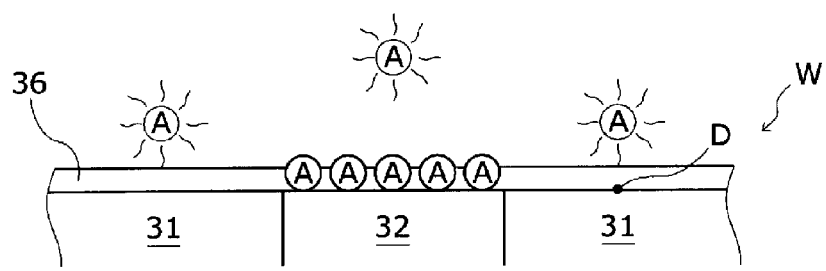
FIG. 8A and FIG. 8B are schematic diagrams illustrating an operation where a catalyst acts when it is attached to a surface of the substrate.
Figure 8B:
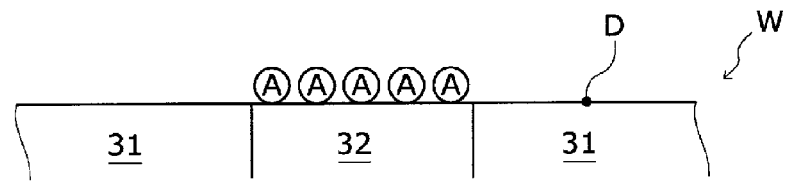

The reason why the catalyst can be suppressed from being attached to the impurity or the like of the non-plateable material portion 31 by the organic film 36 is deemed to be as follows. That is, as shown in FIG. 8A, after a catalyst A is imparted to the substrate W which is covered with the organic film 36 (after the process S6 of FIG. 5), the catalyst A is strongly adsorbed to the plateable material portion 32. Meanwhile, the catalyst A is not substantially adsorbed to the non-plateable material portion 31. Here, even if a fine impurity D (or a lattice defect), which adsorbs the catalyst A, exists at the non-plateable material portion 31, since the organic film 36 is provided between the impurity D and the catalyst A, the adsorption power of the catalyst A is sufficiently weakened. Therefore, as shown in FIG. 8B, after the organic film 36 is removed by cleaning the substrate W (after the process S7 of FIG. 5), the catalyst A in the vicinity of the impurity D is also washed away along with the organic film 36 by the rinse liquid N3 or the like. Meanwhile, the catalyst A adsorbed to the plateable material portion 32 is not washed away by the rinse liquid N3 or the like and remains adsorbed to the plateable material portion 32. As a comparison, if the organic film 36 is not provided on the substrate W, the catalyst A may be adsorbed to the impurity D, so that the plating layer is unintentionally formed at this portion after the plating processing, resulting in a defect.

Furthermore, according to the present exemplary embodiment, there is performed the process of removing the organic film 36 by cleaning the substrate W after the process of imparting the catalyst and before the process of forming the plating layer 35. Accordingly, even if the catalyst is attached to a part of the non-plateable material portion 31, this catalyst is washed away along with the organic film 36. Therefore, the unnecessary plating layer can be suppressed from being formed at the part of the non-plateable material portion 31.

In addition, according to the present exemplary embodiment, after the process of forming the organic film 36 and before the process of imparting the catalyst, the process of heat-treating the substrate W is performed. Therefore, the solvent in the organic liquid L1 can be volatilized, and the polymerization of the organic liquid L1 can be accelerated.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plating method, comprising:
preparing a substrate having, on a surface thereof, a non-plateable material portion to which a catalyst is not substantially adsorbed and a plateable material portion to which the catalyst is adsorbed and made of a different material from the non-plateable material portion, the non-plateable material portion and the plateable material portion being exposed to the surface of the substrate;
imparting a catalyst selectively to the plateable material portion by performing a catalyst imparting processing on the substrate; and
forming a plating layer selectively on the plateable material portion by performing a plating processing on the substrate,
wherein, before the imparting of the catalyst, forming an organic film is performed on the non-plateable material portion and the plateable material portion of the substrate by supplying an organic liquid, which suppresses the catalyst from adhering to the non-plateable material portion, onto the substrate, and
the organic film has a thickness that does not suppress the catalyst from adhering to the plateable material portion.

2. The plating method of claim 1, further comprising:
removing, after the imparting of the catalyst and before the forming of the plating layer, the organic film by performing a cleaning processing on the substrate.

3. The plating method of claim 1, further comprising:
heat-treating the substrate after the forming of the organic film and before the imparting of the catalyst.

4. The plating method of claim 1,
wherein the substrate includes a base member made of the plateable material portion and a core member which is protruded from the base member and is made of the non-plateable material portion.

5. The plating method of claim 1,
wherein the organic liquid contains polyvinylpyrrolidone.

* * * * *

UNITED STATES PATENT AND TRADEMARK OFFICE
CERTIFICATE OF CORRECTION

PATENT NO. : 11,028,483 B2
APPLICATION NO. : 16/344932
DATED : June 8, 2021
INVENTOR(S) : Yuichiro Inatomi et al.

It is certified that error appears in the above-identified patent and that said Letters Patent is hereby corrected as shown below:

In the Specification

Column 4, Line 57, "543a" should be -- 534 --.

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*